United States Patent [19]

Heydt et al.

[11] Patent Number: 5,508,623

[45] Date of Patent: Apr. 16, 1996

[54] APPARATUS AND METHOD TO IDENTIFY HARMONIC PRODUCING LOADS

[75] Inventors: Gerald T. Heydt, West Lafayette, Ind.; Atulya Risal, Tampa, Fla.

[73] Assignee: Purdue Research Foundation, West Lafayette, Ind.

[21] Appl. No.: 310,247

[22] Filed: Sep. 21, 1994

[51] Int. Cl.$^6$ .......................... G01R 23/165; G01R 23/20
[52] U.S. Cl. ...................... 324/623; 324/520; 324/76.29; 307/105
[58] Field of Search ............................ 324/76.11, 76.12, 324/76.28, 76.29, 76.44, 520, 620, 623; 340/658, 660, 664; 307/105

[56] References Cited

U.S. PATENT DOCUMENTS

| | | | |
|---|---|---|---|
| 4,667,152 | 5/1987 | Hayes et al. | 324/76.12 |
| 4,818,947 | 4/1989 | Zucker et al. | 324/623 |
| 5,072,187 | 12/1991 | Shilo | 324/623 |
| 5,300,924 | 4/1994 | McEachern et al. | 324/107 |
| 5,343,404 | 8/1994 | Girgis | 324/623 |
| 5,347,464 | 9/1994 | McEachern et al. | 324/520 |
| 5,383,084 | 1/1995 | Gershen et al. | 324/520 X |

FOREIGN PATENT DOCUMENTS 362159058A  7/1987  Japan ..................................... 324/623

OTHER PUBLICATIONS

Heydt, G. T., "Indentification of Harmonic Sources by a State Estimation Technique", IEEE Transactions on Power Delivery, vol. 4, No. 1, pp. 569–576, Jan. 1989.

Winn, John K., Jr. et al., "Harmonic Measurement Using a Digital Storage Oscilloscope", IEEE Transactions on Industry Applications, vol. 25, No. 4, pp. 783–788, Jul./Aug., 1989.

Teshome, Asrat, "Harmonic Source and Type Indentification in a Radial Distribution System", IEEE Insdustry Application Society Meeting, pp. 1605–1609, Sep., 1991.

Jalluria, Naveen, "Detection of Harmonic Loads on a Power System Under Practical Conditions of Non–Sinusoidal Voltages and Variable Frequency", Masters Thesis, Purdue University, Dec., 1993.

Farach, J. E., et al., "An Optimal Procedure for Placing Sensors and Estimating Locations of Harmonic Sources in Power Systems", IEEE Transactions on Power Delivery, vol. 8, No. 3, pp. 1303–1310, Jul., 1993.

Primary Examiner—Kenneth A. Wieder
Assistant Examiner—Glenn W. Brown
Attorney, Agent, or Firm—Flehr, Hohbach, Test, Albritton & Herbert

[57] ABSTRACT

An apparatus and method to identify a harmonic producing load on a utility electrical network is described. The apparatus is connected to the utility electrical network at a location adjacent to a load. The apparatus includes a network voltage node to receive a voltage signal, and a network current node to receive a current signal. The apparatus also includes harmonic filters to process the voltage signal and current signal to isolate selected harmonic voltage signals and selected harmonic current signals. A signal processor derives a set of selected power signals from the selected harmonic voltage signals and the selected harmonic current signals. The signal processor also identifies any positive polarity signals in the set of selected power signals. In response to a positive polarity signal, the signal processor activates a sensory output device to indicate that harmonics are being produced by the load.

19 Claims, 2 Drawing Sheets

1

APPARATUS AND METHOD TO IDENTIFY HARMONIC PRODUCING LOADS

BRIEF DESCRIPTION OF THE INVENTION

This invention relates generally to the field of controlling the quality of power on a utility electrical network. More particularly, this invention describes a method and apparatus to identify loads on a utility electrical network that are producing harmonics.

BACKGROUND OF THE INVENTION

The distortion of voltages and currents on utility electrical networks is increasing. The distortion problem is largely attributable to a growing number of nonlinear loads on the utility electrical network. Typical nonlinear loads are computer controlled data processing equipment, numerical controlled machines, variable speed motor drives, robotic devices, electronically switched loads such as lamp dimmers, rectifier loads (especially single phase devices), battery chargers (e.g., battery chargers for electric vehicles), medical equipment, and communication equipment.

Nonlinear loads draw square wave or pulse-like currents instead of purely sinusoidal currents drawn by conventional linear loads. As a result, non-sinusoidal current flows through the predominantly inductive source impedance of the electrical network. Consequently, a nonlinear load causes load harmonics and power to flow back into the power source. This in turn produces unacceptable voltage harmonics.

Harmonics create a variety of problems. For example, harmonic currents cause increased eddy current and hysteresis losses in the iron cores of transformers and other magnetic devices. By producing unwanted noise on communication channels, harmonic currents may interfere with the normal operation of communication circuits. The same problem can occur in power system protective relaying circuits that rely on communications channels. The harmonic problem is compounded by the growing presence of power factor correction capacitors on utility electrical networks. Power factor correction capacitors detrimentally operate as low impedance paths to higher order harmonics. Consequently, harmonics may overload power factor correction capacitors and force them to fail due to increased dielectric losses and stress.

The degree of current or voltage distortion can be expressed in terms of the relative magnitudes of harmonics in the waveforms. Total Harmonic Distortion (THD) is one of the accepted standards for measuring voltage or current quality in the electric power industry.

Although harmonics are present at all levels of a power system, the magnitude of the problem is of main concern in primary and secondary distribution circuits. The primary distribution circuits are the high voltage circuits that are energized by the sub-transmission or transmission systems. Secondary distribution circuits are the lower voltage circuits at the secondaries of distribution transformers. In the primary distribution circuits, the current THD levels are usually low (approximately 5–20%). In the secondary distribution circuits, the THD levels are greater (typically 7–30%).

Harmonic standards have been introduced all over the world. IEEE Standard 519 serves as a guideline for designing systems with linear and nonlinear loads. It also defines the quality of power to be supplied by the utility to the consumer at the point of common coupling. In enforcing the standards, it will be necessary to determine who, the utility or the consumer, is responsible for some or all of the distortion. Consequently, it would be useful to be able to determine within reasonable accuracy, the loads responsible for the generation of harmonics. Thereafter, known filtering techniques and other electronic measures can be used to mitigate the harmonics.

There has been a considerable effort placed on the study of the propagation of harmonic signals from a given source into the network. Most of the work focuses on modifying the power flow algorithm to accommodate harmonic signals. Although generators are the source of all energy on a utility electrical network, harmonic flow studies treat non-linear loads as the source of harmonics in similar fashion that loads are treated as sinks in power flow studies.

Sophisticated work has been performed to simulate the flow of harmonics into the utility electrical network. However, this work requires a priori knowledge of the location of a harmonic source. Furthermore, the measurements need to be highly accurate in both magnitude and phase of harmonic current and voltage.

Prior art techniques for identifying harmonic sources are relatively complicated. For example, one technique requires multiple measurements at various buses within a network to identify a harmonic source. Another technique is to gather information at a single location and subsequently use Fourier transforms to find the magnitude and phase of the harmonic components in the current and voltage waveforms. Because the interpretation of this data is difficult, artificial neural networks have been proposed to simplify the task. Unfortunately, artificial neural networks add another computation to the process of identifying a harmonic source. Moreover, a time-consuming training operation must be performed before the neural networks can be used.

Thus, it would be highly desirable to provide a relatively simple mechanism to identify the presence of a harmonic producing load on a utility electrical network.

SUMMARY OF THE INVENTION

The invention is an apparatus and method to identify a harmonic producing load on a utility electrical network. The apparatus is connected to the utility electrical network at a location adjacent to a load (e.g., the metering point). The apparatus includes a network voltage node to receive a voltage signal, and a network current node to receive a current signal. The apparatus also includes harmonic filters to process the voltage signal and current signal to isolate selected harmonic voltage signals and selected harmonic current signals. A signal processor derives a set of selected power signals from the selected harmonic voltage signals and the selected harmonic current signals. The signal processor also identifies any positive polarity signals in the set of selected power signals. In response to a positive polarity signal, the signal processor activates a sensory output device to indicate that harmonics are being produced by the load.

In accordance with the method of the invention, a power signal adjacent to a load is measured. The power signal is then filtered to identify selected harmonic voltage signals and selected harmonic current signals. The selected harmonic voltage signals and the selected harmonic current signals are processed to generate corresponding selected power signals. The selected power signals are interpreted to identify active power flow signals that indicate the production of harmonics at the load.

There are a number of obvious benefits associated with the apparatus and method of the invention. First, since only selected harmonic signals are processed, the computational expense of the technique is low. Consequently, the apparatus provides an instantaneous indication as to whether a load is producing harmonics. Another advantage of the invention is that it may be physically implemented using a unique combination of reliable known elements. This aspect of the invention allows for a relatively simple apparatus that is highly reliable. Another advantage of the invention is that it can be implemented with low cost components.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
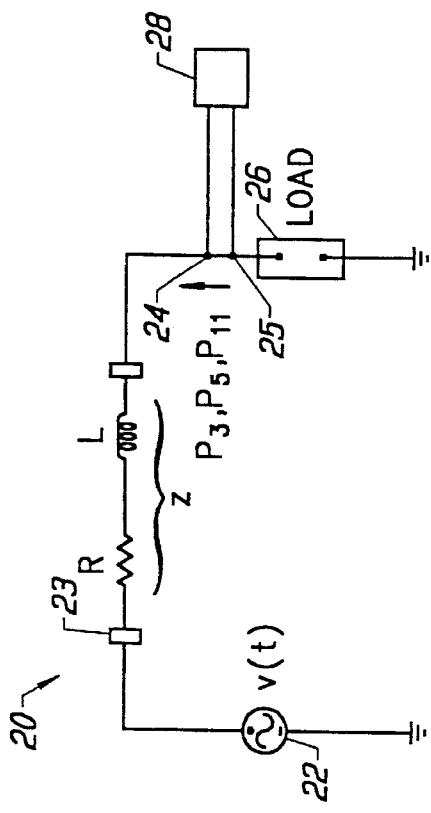
FIG. 1 illustrates a utility electrical network incorporating the apparatus of the invention.

FIG. 1 is a simplified illustration of a utility electrical network 20. The utility electrical network 20 includes a voltage source 22 that delivers a voltage signal to a transmission line 23. The transmission line 23 includes a source resistance R and a source inductance L, collectively identified as Z. The transmission line 23 terminates at a load 26. As used herein, a load 26 refers to one or more loads. The load harmonic identification apparatus 28 of the invention is connected to the transmission line 23 through a network voltage node 24 and a network current node 25.

The load harmonic identification apparatus 28 of the invention is used to identify whether the load 26 is a source of harmonics. Harmonics may be attributable to other loads connected to the transmission line 23. Consequently, it is important to note that the apparatus of the invention does not merely identify the presence of harmonics, rather it identifies whether harmonics are actually being generated by a particular load 26.

The load harmonic identification apparatus 28 identifies whether selected harmonics are injecting active (real) power back toward the source 22. In FIG. 1, power signals P3, P5, and P11, respectively corresponding to the power signal for the third harmonic, fifth harmonic, and eleventh harmonic of the fundamental power signal, are shown as being injected toward the source 22. Thus, in this case, load 26 is a harmonic producing load.

A harmonic producing load will usually generate at least one active positive power signal at a selected harmonic frequency. Unlike prior art approaches, the present invention uses a relatively simple apparatus and method to identify the positive power signal at a selected harmonic frequency generated by a harmonic producing load.

The methodology of the invention is to filter the power signal to obtain selected harmonic signals of the power signal. Preferably, the selected harmonic signals include the third, fifth, and eleventh harmonic signals. Positive value harmonic signals are then identified within the selected harmonic signals. A positive value harmonic signal triggers an indicator to identify the existence of a harmonic producing load.

Those skilled in the art will recognize a number of benefits associated with this methodology. First, since only selected harmonic signals are processed, the computational expense of the technique is low. This approach stands in stark contrast to prior art approaches that endeavor to interpret a broad spectrum of harmonic signals. The prior art approach requires a post-data gathering analysis. In other words, the prior art technique is not executed in real-time. Moreover, prior art techniques rely upon computationally expensive devices such as artificial neural networks to interpret the spectrum of harmonic signals.

Another advantage of the invention is that it may be physically implemented using a unique combination of low cost, reliable, and widely available elements. Another advantage of the invention is that it relies upon local measurements, thereby obviating the need for complex remote measurements.

Figure 2:
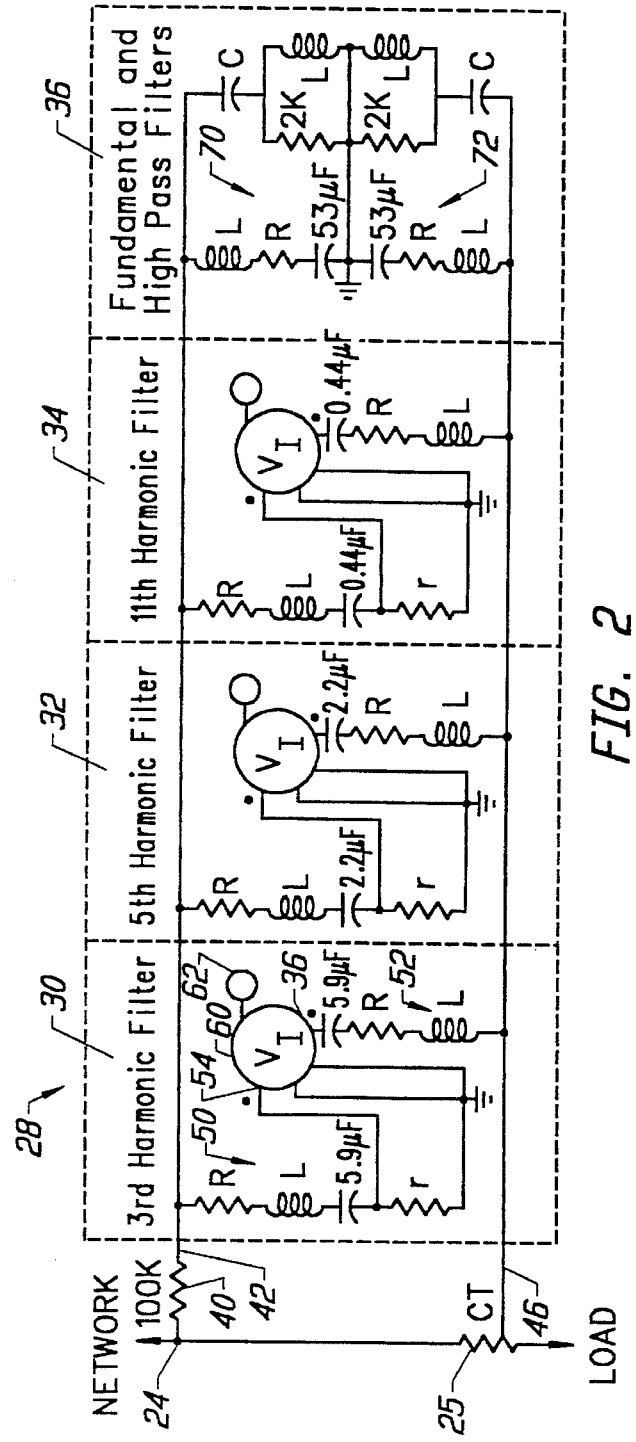
FIG. 2 illustrates an analog embodiment of the apparatus of the invention.

The physical implementation of the invention will now be described. An analog embodiment of the invention is illustrated in FIG. 2. The load harmonic identification apparatus 28 includes a third harmonic filter 30, a fifth harmonic filter 32, an eleventh harmonic filter 34, and a combination fundamental and high pass filter 36. The apparatus 28 is connected to the utility electrical network through a network voltage node 24 a network current node 25. The network current node may be implemented in the form of a current transformer or other current transducer. The network voltage node 24 may be implemented as a voltage transformer or other voltage transducer. As shown in FIG. 2, a low power resistor 40 is used to isolate the harmonic source detection apparatus from the power circuit 20. The isolation resistor 40 produces a low voltage signal on a voltage bus 42. The low voltage signal corresponds to the voltage component of the power signal on the transmission line 23. The current transformer 44 also produces a low current signal on a current bus 46. The low current signal corresponds to the current component of the power signal on the transmission line 23.

The third harmonic filter 30 includes a third harmonic voltage LC resonant circuit 50, and a third harmonic current LC resonant circuit 52. The third harmonic voltage LC resonant circuit 50 generates a high impedance path for all components of the low voltage signal on the voltage bus 42, except for the third harmonic voltage. That is, the LC resonant circuit 52 resonates at the frequency of the third harmonic (for a 60 Hz system, this is 3×60 Hz= 180 Hz). At this frequency, the reactance of the inductor L and capacitor C cancel. At every other frequency, the LC resonant circuit presents a high impedance path.

In sum, the circuit 50 produces a filtered third harmonic voltage signal at the voltage node 54. Similarly, the third harmonic current LC circuit 52 generates a high impedance path for all components of the low current signal on the low current bus 46, except for the third harmonic current. Consequently, the circuit 52 produces a filtered third harmonic current signal at the current node 56.

The third harmonic filter 30 also includes a wattmeter 60. The wattmeter 60 only reads the filtered third harmonic voltage signal received at voltage node 54 and the third harmonic current signal received at current node 56. If the wattmeter 60 produces a positive signal, than a sensory output device 62 is activated. The sensory output device may be in the form of a visual indicator such as a light emitting diode, an audible indicator, an incandescent or other lamp, a liquid crystal display showing the power reading, a cathode ray tube showing the power reading, a flat panel screen showing the power reading, or equivalent device known to those skilled in the art.

In the third harmonic filter 30 illustrated in FIG. 2, R= 1 Ohm, L=0.132 H, and r= 0.1 Ohm. The operation of the fifth harmonic filter 32 and eleventh harmonic filter 34 is the same, except the capacitance of the LC resonant circuit 50 is modified, as shown in FIG. 2, to generate the appropriate resonant condition at the fifth harmonic (300 Hz) and the eleventh harmonic (660 Hz). The circuit parameters shown for R, L and r in FIG. 2 are representative of a wide range of values that can be used. These values are calculated using elementary circuit theory and the formula for the resonance of LC circuits.

The fundamental and high pass filter 36 of FIG. 2 operates in an analogous manner. A fundamental voltage RLC filter 70 is tuned to short the voltage fundamental signal to ground, while a fundamental current RLC filter 72 is tuned to short the current fundamental signal to ground. The circuit 36 also includes a high pass branch that includes a set of capacitors (C=0.313 MicroFarads) to short high harmonic signals (e.g., noise) to ground.

Figure 3:
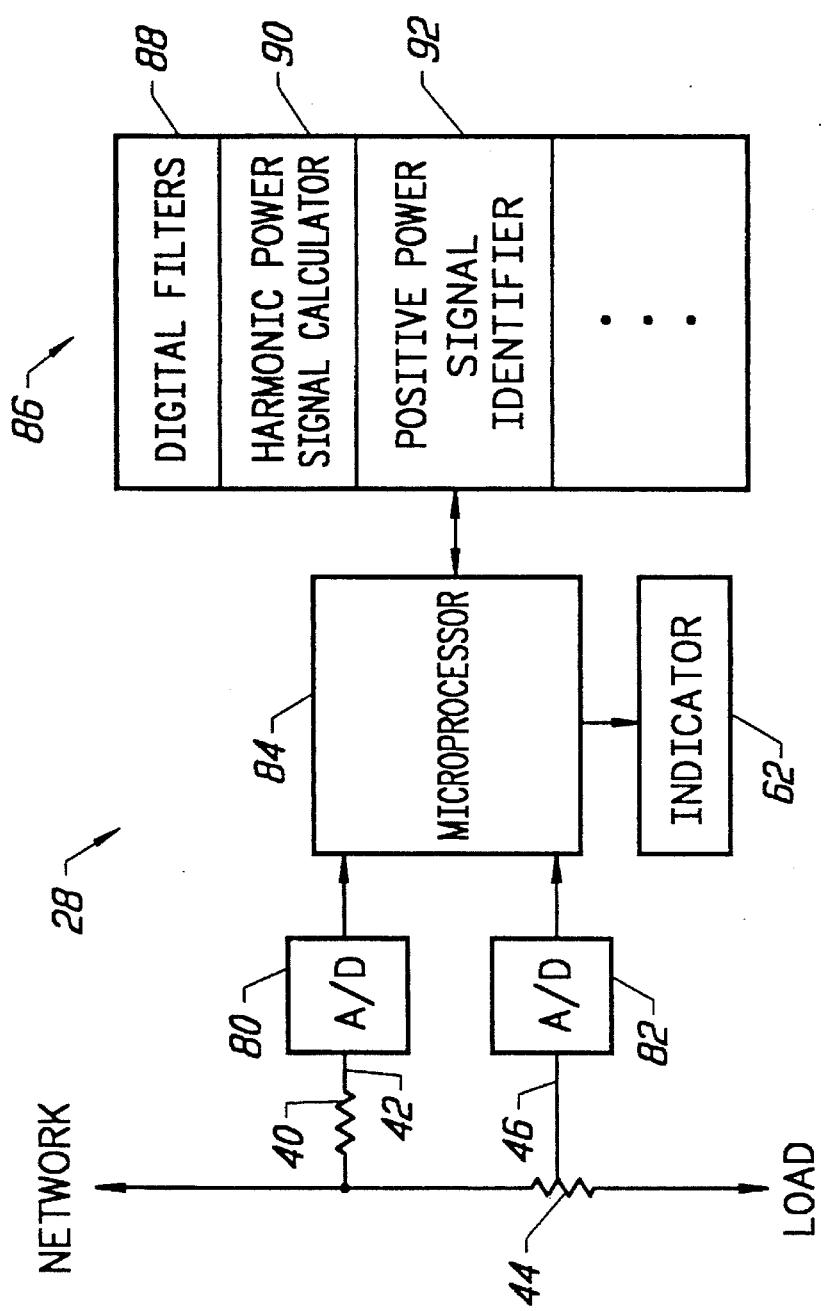
FIG. 3 illustrates a digital embodiment of the apparatus of the invention.

FIG. 3 illustrates a digital embodiment of the apparatus of the invention. In the apparatus of FIG. 3, the low voltage signal on the voltage bus 42 is sampled by an analog-to-digital converter 80 to generate a digital voltage output signal. Similarly, the low current signal on the current bus 46 is sampled by an analog-to-digital converter 82 to generate a digital current output signal.

The digital voltage output signal and the digital current output signal are delivered to a microprocessor 84. The microprocessor 84 is connected to (or incorporates) a memory device 86. The memory device 86 stores a set of instructions that are executed by the microprocessor 84. One set of instructions constitute digital filters 88 for selected harmonics. Preferably, digital filters 88 for the third, fifth, and eleventh harmonic signals are provided. In addition, digital filters for the fundamental and high harmonic component signals are provided. Digital filters 88 for execution on a general purpose computer are known in the art.

As in the case of the analog embodiment of the invention, the filters 88 generate selected harmonic voltage signals and selected harmonic current signals. The harmonic power signal calculator 90 multiplies corresponding selected harmonic voltage signals and selected harmonic current signals to obtain a set of harmonic power signals corresponding to the selected harmonics. For example, the harmonic power signal calculator 90 multiplies the third harmonic current signal and the third harmonic voltage signal and the cosine of the angle between the third harmonic voltage and current to obtain a third harmonic active power signal $P_3$.

The microprocessor also executes a set of operations constituting a positive power signal identifier 92. These instructions force the microprocessor to identify any positive value harmonic power signals generated by the harmonic power signal calculator 90. If such a signal is identified, then the microprocessor 84 generates a control signal to activate a sensory output device 62.

The method and apparatus of the invention has now been fully described. Nevertheless, the nature of the invention may be more fully appreciated by the following discussion of the underlying theory associated with the invention and specific numerical examples of the operation of the invention.

Returning to FIG. 1, let the notation $P_T$ denote the total active power injected into the network by the load at frequency $i\omega_o$. The total active power is $P_T$, $$P_T = \sum_{i=1}^{\infty} P_i$$

where $P_i$ refers to the individual harmonic components of power (i.e., due to harmonic voltages and currents of the same frequency, $i\omega_o$). If the load is a fixed impedance, $Z_{load}$ with a positive real part $Re\{Z_{load}\} > 0$, the components $P_i$ must be negative. This is a consequence of the passive nature of $Z_{load}$, no matter what voltage is applied to the load 26. Thus, for a linear load, $P_i < 0$ for all i.

On the other hand, if any $P_i > 0$, the load is active (i.e., generates power) at frequency $i\omega_o$. Therefore, if $P_i > 0$ for any i, the load is definitely producing harmonics. Unfortunately, the converse of this conclusion is not necessarily true. That is, if $P_i < 0$ for all i, the load may still be a harmonics source.

A numerical example of the invention may serve to illustrate its principles more fully. Consider the case of a 60 Hz system with a load of fixed L and R as $1/120\pi$ henries and 1 ohm respectively. Let the unloaded supply voltage have 3% THD and let the measured components be $v_1(t) = \cos(120\pi t)$ $v_2(t) = v4(t) = 0$ $V_3(t) = 0.02 \cos(360\pi t - \pi/2)$ $v_5(t) = 0.02236 \cos(600\pi t + 2.001)$ $v_{11}(t) = 0$ In these expressions, the arguments of the trigonometric functions are in radians.

For the case that the supply L, R are $0.01/120\pi$ henries and 0.01 ohm, it is a simple matter to calculate the harmonic current components of $i_L(t)$ and determine $P_1 = -0.24025$ $P_2 = P4 = P11 = 0$ $P_3 = -3.9219 \times 10^{-5}$ $P_5 = -1.8851 \times 10^{-5}$ Since $P_3 < 0$ and $P_5 < 0$, one assumes that this load is not a harmonic source.

A second example is illustrative of a typical six pulse rectifier load. Let the supply voltage be the same 3% voltage THD source, but this time the load current components are measured as:

$i_1(t) = 0.24025 \cos(120\pi t\ 3.1940)$ $i_2(t) = i4(t) = 0$ $i_3(t) = 0.0701 \cos(360\pi t + 3.3161)$ $i_5(t) = 0.03 \cos(600\pi t + 3.4907)$ $i_{11}(t) = 0.003 \cos(1320\pi t - 3.1151)$ Then, $P_1 = -0.23992$ $P_2 = P4 = P11 = 0$ $P_3 = 0.00024$ $P_5 = 5.4339 \times 10^{-5}$ In this case, the positive values of $P_3$ and $P_5$ indicate that the load is a harmonic source. Note that the low levels of harmonic voltages result in near zero harmonic power delivered. Therefore, the harmonic current generated by the load, if any, results in active power lost in the distribution transformer and network. For this reason, $P_i$, i> 1, will usually be positive if the load is a harmonic source.

Attention now turns to preferred implementation details and alternate embodiments of the invention. Preferably, an isolation resistor 40 and a wide band current transformer 44 are used so that the filters 30–36 can operate at low power levels. In some applications, it may be preferable that filters 30–36 operate at high power levels.

It should be appreciated that load harmonic identification apparatus 28 may be physically connected at or near the load in a number of ways. A permanent connection may be made in the same way as a revenue meter. In such an embodiment, it would be desirable to modify the sensory output device to include a link to a central control computer that continuously monitors the activity of a set of load harmonic identification devices 24. The link may be formed using wireless technology techniques or by using a dedicated line. Alternately, a continuous reading may be recorded by a recording device physically located at the load site. The recorder may be examined periodically to determine if harmonics were generated at the site. A temporary connection may also be made for portable field use. In this embodiment, a clamp structure is used for the network voltage node 24 and the network current node 25. In this configuration, the sensory output device may merely provide some visual or audio signal to the operator of the portable device.

The parameters in the analog circuit of FIG. 2 were implemented so that the sensitivity of individual harmonic measurements to the change in fundamental frequency component was minimal. The "Q" factor for each filter 30–36 was designed to be approximately 50. Naturally, a wide range of "Q" factors are feasible.

The invention has described the processing of selected harmonic signals. As indicated above, it is desirable to limit the amount of data to be processed. However, it should be appreciated that the invention may be implemented using a large number of individual harmonic filters. Nevertheless, reliance upon the processing of third, fifth, and eleventh harmonics is preferable for the following reasons. In many cases of single phase non-linear loads, considerable third harmonic phase current may occur. Some practical field studies indicate that the third harmonic may be the predominant harmonic current. Fifth harmonic phase currents commonly occur in six-pulse technologies. In addition, when the third harmonic current is not of high amplitude, the fifth harmonic usually dominates. In local circuits near a twelve-pulse converter, there may be a considerable eleventh harmonic signals. Consequently, the third, fifth, and eleventh harmonic components span the majority of cases of interest. It should also be appreciated that the invention has been described in the context of a 60 Hz fundamental signal, the power signal frequency used commercially in the United States. Naturally, the invention is equally applicable to other power signal frequencies, and therefore harmonic frequencies, used in military applications (e.g., 400 Hz) or used throughout the world (e.g., 50 Hz).

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. An apparatus to identify a harmonic producing load connected to a utility electrical network, said apparatus comprising:

a network voltage node connected to said utility electrical network to receive a voltage signal existing proximate to a load;

a network current node connected to said utility electrical network to receive a current signal existing proximate to said load;

a set of harmonic filters
        connected to said network voltage node to process said voltage signal to produce a corresponding set of selected harmonic voltage signals, and
        connected to said network current node to process said current signal to produce a corresponding set of selected harmonic current signals;

a signal processor connected to said set of harmonic filters
        to process said selected harmonic voltage signals and said selected harmonic current signals to generate a corresponding set of selected power signals, and
        to identify a positive polarity signal, in said set of selected power signals, and generate an output signal in response thereto, said output signal indicative of a harmonic producing load; and a sensory output device responsive to said output signal to provide a sensory indication of said harmonic producing load.

2. The apparatus of claim 1 wherein said network current node is a current transformer.

3. The apparatus of claim 1 wherein said set of harmonic filters includes a set of harmonic voltage filters and a set of harmonic current filters.

4. The apparatus of claim 3 further comprising an isolation resistor positioned between said network voltage node and said set of harmonic voltage filters.

5. The apparatus of claim 3 wherein said set of harmonic voltage filters includes a third harmonic filter, a fifth harmonic filter, and an eleventh harmonic filter.

6. The apparatus of claim 5 wherein said third, fifth, and eleventh harmonic filters are implemented as resonant LC circuits.

7. The apparatus of claim 5 wherein said third, fifth, and eleventh harmonic filters are implemented as digital filters operating in conjunction with a microprocessor.

8. The apparatus of claim 3 wherein said set of harmonic current filters includes a third harmonic filter, a fifth harmonic filter, and an eleventh harmonic filter.

9. The apparatus of claim 8 wherein said third, fifth, and eleventh harmonic filters are implemented as resonant LC circuits.

10. The apparatus of claim 8 wherein said third, fifth, and eleventh harmonic filters are implemented as digital filters operating in conjunction with a microprocessor.

11. The apparatus of claim 1 wherein said signal processor includes a set of wattmeters.

12. The apparatus of claim 1 wherein said signal processor is a microprocessor executing a set of program instructions.

13. The apparatus of claim 1 wherein said sensory output device is selected from the group including, a visual indicator, an audible indicator, a liquid crystal display, a cathode ray tube, and a flat panel screen.

14. A method to identify harmonic producing loads on a utility electrical network, said method comprising the steps of:

measuring a power signal delivered to a load connected to said utility electrical network;

filtering said power signal to identify selected harmonic voltage signals and selected harmonic current signals;

processing said selected harmonic voltage signals and said selected harmonic current signals to generate corresponding selected power signals; and interpreting said selected power signals to identify positive polarity power signals in said selected power signals indicative of the production of harmonics at said load.

15. The method of claim 14 wherein said measuring step includes the steps of measuring a voltage signal through an isolation resistor connected to said utility electrical network; and measuring a current signal through a current transformer connected to said utility electrical network.

16. The method of claim 15 wherein said filtering step includes the step of filtering said voltage signal and said current signal with a third harmonic filter, a fifth harmonic filter, and an eleventh harmonic filter.

17. The method of claim 16 wherein said filtering step includes the step of filtering said selected harmonic voltage signals and said selected harmonic current signals with resonant LC filters.

18. The method of claim 16 wherein said filtering step includes the step of filtering said selected harmonic voltage signals and said selected harmonic current signals with digital filters operating in conjunction with a microprocessor.

19. The method of claim 14 further comprising the step of providing a sensory indication when said interpreting step identifies positive polarity power signals in said selected power signals.

\* \* \* \* \*